US010249662B2

(12) United States Patent
Huang

(10) Patent No.: US 10,249,662 B2
(45) Date of Patent: Apr. 2, 2019

(54) MULTISPECTRAL IMAGING DEVICE AND MANUFACTURING METHOD THEREOF

(71) Applicant: EXPANTRUM OPTOELECTRONICS, Shanghai (CN)

(72) Inventor: Zhongshou Huang, Shanghai (CN)

( * ) Notice: Subject to any disclaimer, the term of this patent is extended or adjusted under 35 U.S.C. 154(b) by 0 days.

(21) Appl. No.: 15/816,176

(22) Filed: Nov. 17, 2017

(65) Prior Publication Data

US 2019/0057988 A1 Feb. 21, 2019

(30) Foreign Application Priority Data

Aug. 18, 2017 (CN) .......................... 2017 1 0713001

(51) Int. Cl.

| | |
|---|---|
| ***H01L 31/062*** | (2012.01) |
| ***H01L 27/146*** | (2006.01) |
| ***H01L 31/0376*** | (2006.01) |
| ***H01L 31/20*** | (2006.01) |
| ***H01L 31/0224*** | (2006.01) |
| *H01L 21/223* | (2006.01) |
| *H01L 31/103* | (2006.01) |

(52) U.S. Cl.

CPC ...... *H01L 27/1462* (2013.01); *H01L 27/1461* (2013.01); *H01L 27/14647* (2013.01); *H01L 27/14649* (2013.01); *H01L 27/14685* (2013.01); *H01L 27/14692* (2013.01); *H01L 31/022475* (2013.01); *H01L 31/03762* (2013.01); *H01L 31/202* (2013.01); *H01L 21/2236* (2013.01); *H01L 27/14621* (2013.01); *H01L 31/103* (2013.01)

(58) Field of Classification Search

CPC ........... H01L 27/1461; H01L 27/14647; H01L 27/14649; H01L 27/14685; H01L 27/14692

USPC ....... 257/257, 258, 290, 291, 292, 461, 462, 257/444

See application file for complete search history.

(56) References Cited

U.S. PATENT DOCUMENTS 8,822,980 B2 * 9/2014 Hayashi ............ H01L 27/14645 257/40

* cited by examiner

*Primary Examiner* — Tan N Tran

(57) ABSTRACT

The present disclosure provides a multispectral imaging device, comprising the following layers and components arranged in sequence following a direction of incident light: a color filter layer, comprising a plurality of color filters transparent for specific wavebands; a first transparent electrode layer continuously formed in imaging area; a first conversion layer continuously formed in imaging area to convert visible light to electric signals; a first flat topography comprising plurality of pixel electrodes and with surface roughness less than 5 nm; a second conversion layer to convert NIR light to electric signals; and circuit components to process the electric signals. Benefit from the first continuous conversion layer formed on the flat topography, high light utilization, low spectral cross-talk, low dark current are achieved in the multispectral imaging device.

14 Claims, 13 Drawing Sheets

MULTISPECTRAL IMAGING DEVICE AND MANUFACTURING METHOD THEREOF

CROSS-REFERENCE TO RELATED APPLICATIONS

This application is based upon and claims the benefit of priority from Chinese Patent Application No. 201710713001.4 filed on Aug. 18, 2017, the entire contents thereof are incorporated herein by reference.

TECHNICAL FIELD

The present disclosure relates to the field of medical diagnosis instrument, specifically to a multispectral imaging device and manufacturing method thereof.

BACKGROUND

In recent years, infrared light imaging devices have been widely used in the fields of medical image diagnosis devices, night surveillance camera, night vision system for driving, biometric identification, machine vision, testing of food quality, detecting surface of industrial products and etc, and can further be used in more fields benefited from the development of mobile terminal like cell phones. Though a human vision is sensitive only to visible light from 400 nm to 760 nm, by adopting materials sensitive to invisible light wavebands, from X ray to far-infrared light, invisible image can be converted into electronic image and displayed in the form of visible light image, and thus can be viewed by naked eyes indirectly. In order to establish a comprehensive understanding for an object, human brain or artificial intelligence has to associate the image data sets in multiple wavebands pixel by pixel. For this reason, acquiring multispectral image data in the same viewing angle and in the same time becomes absolutely necessary.

For this purpose, a multispectral imaging system with dual cameras which capture visible light and infrared light respectively has been developed. The dual-camera system, however results in large body and weight, and therefore high cost. Two optical axes in the dual-camera system inevitably add a complicated image data calibration process. To avoid these problems, an imaging device sensitive to both visible light and infrared light also has been developed, such as a CCD or CMOS imaging device formed on a silicon chip, to collect and process images of visible light and infrared light respectively in different time slots. However, this kind of imaging device, no matter adopting a mechanical chopper or an electronic shutter, comes with not only a complex structure, but also position errors for moving objects.

SUMMARY

The primary purpose of the present disclosure is to provide a multispectral imaging device and the manufacturing method thereof, to realize multispectral imaging with high resolution.

According to one aspect of the present disclosure, a multispectral imaging device is provided, comprising the following layers and components arranged in sequence following the direction of incident light: a color filter layer, comprising an array of a plurality of color filters, transparent selectively for specific wavebands; a first transparent electrode layer transparent for visible light and near-infrared (NIR) light; a first conversion layer to convert visible light to electric signals; a first continuous surface formed by a second transparent electrode layer and a first insulating film; a second conversion layer, to convert NIR light to electric signals; and circuit components, to process the electric signals from the first conversion layer and the second conversion layer, respectively. Wherein, the second transparent electrode layer comprises a pixel electrode array formed by a plurality of pixel electrodes collecting electric signal of visible light and transparent for NIR light, the first insulating film is arranged between the pixel electrodes, the first conversion layer is arranged between the first transparent electrode layer and the first continuous surface, and the first conversion layer covers the first continuous surface continuously.

According to another aspect of the present disclosure, a manufacturing method of a multispectral imaging device is provided, comprising: providing a silicon substrate; forming circuit components processing photo-generated charge signals on the silicon substrate; forming a second conversion layer on the silicon substrate to convert infrared light to electric signals; forming an insulating film on the second conversion layer, and sputtering the material of a transparent conductive film onto the insulating film by PVD process to form a second transparent electrode layer and etching the second transparent electrode layer to form a pixel electrode array, the material of the transparent conductive film comprising an ITO or $SnO_2$ component, and the material being kept in an amorphous state, to have a lower hardness and a more smooth surface during the later polishing process; forming a first insulating film by coating or CVD process, with an average height larger than the height of the pixel electrode and the first insulating film covering completely the pixel electrode array; polishing the pixel electrode array and the first insulating film by CMP process till each pixel electrode of the array is exposed; thereby the pixel electrode and the first insulating film forming the first continuous surface with a surface roughness less than 5 nm. The surface roughness hereafter is defined by a mean standard deviation of vertical distance from an average height of the surface within a sampling length equal to pixel pitch of the imaging device. After the polishing process, the pixel electrode array and the first insulating film is processed by annealing with a temperature above 300 degree centigrade to eliminate the surface stress and damage caused by mechanical polishing, and the ITO electrode material in amorphous state is processed to increase the light transmittance and adjust the surface work function thereof. Such kind of surface process can be performed by plasma treatment in a reaction chamber having oxygen or other methods.

On the first continuous surface, a first conversion layer and a first transparent electrode layer are formed continuously without any etching process not only to simplify the technological process, but also to avoid all kinds of chemical contamination and physical damage to the conversion layer.

On that account, in the present disclosure, multiple layers are deposited on the first continuous surface with a surface roughness less than 5 mm and almost equal to a mirror surface. Therefore the strength of the electric field at edges and corners of each separate pixel electrode is decreased greatly, to decrease the local leakage current of the visible light conversion layer at the edge of the pixel electrode. Besides, with the arrangement of the electron or hole blocking layer in the visible light conversion layer and the buffer area for electric field close to the electron or hole blocking layer, the present disclosure also decreases the dark current injected from the anode or cathode, and increases the homogeneity and signal to noise ratio of signals.

BRIEF DESCRIPTION OF THE DRAWINGS

By reading the detailed description of nonrestrictive embodiment referring to the figures below, the other features, objects and advantages will be more apparent.

DETAILED DESCRIPTION

In the following, embodiments of the present disclosure will be described in detail referring to figures. The concept and its realizations of the present disclosure may be implemented in a plurality of forms, and should not be understood to be limited to the embodiments described hereafter. In contrary, these embodiments are provided to make the present disclosure more comprehensive and understandable, and so the conception of the embodiments may be conveyed to the person skilled in the art fully. Same reference numbers in the figures refer to same or similar structures, so repeated description of them will be omitted.

The features, structures or characteristics described may be combined in any appropriate way in one or more embodiments. In the description below, many specific details are provided to explain the embodiments of the present disclosure fully. However, the person skilled in the art should realize that, without one or more of the specific details, or adopting other methods, components, materials etc., the technical approach of the present disclosure may still be realized. In certain conditions, structures, materials or operations well known are not shown or described in detail so as not to obfuscate the present disclosure.

Figure 1:
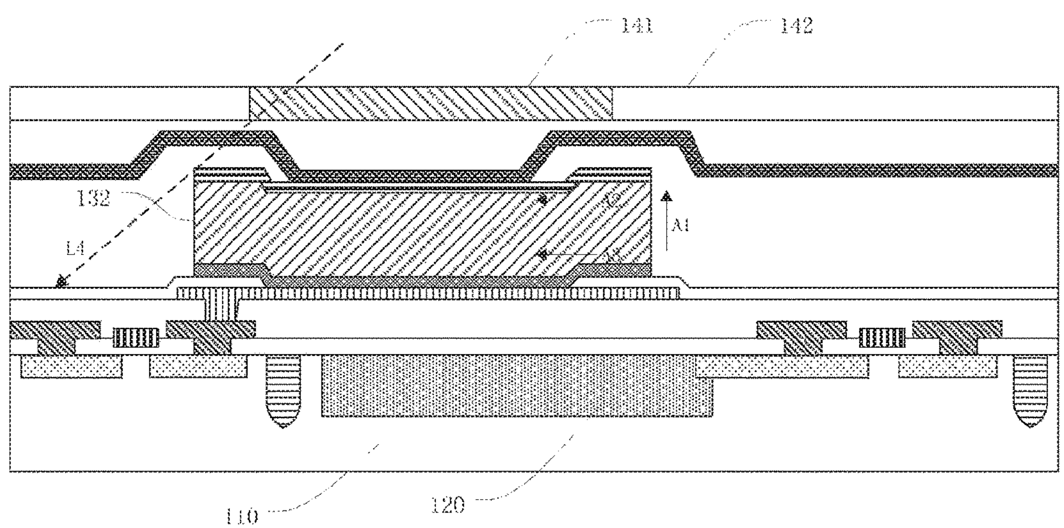
FIG. 1 is a cross-sectional view of a multispectral imaging device.

FIG. 1 is a cross-sectional view of a multispectral imaging device. The multispectral imaging device comprises a color filter layer comprising a color filter 141 and a black matrix 142; a transparent electrode layer; a visible light conversion layer 132 comprising an a-SiH photodiode to convert visible light to electric signals; a infrared light conversion layer 120 to convert infrared light to electric signals; and a substrate 110 formed of silicon chip. The visible light conversion layer is in island shape, therefore a part of light irradiating obliquely with a wide angle can pass through the color filter 141 and the transparent electrode layer on the top to irradiate the substrate on the bottom, thereby causing photo-generated leakage current. To prevent from such kind of leakage light, the black matrix 142 has to be wide enough to cover a part of the area irradiated by light of the a-SiH photodiode 132. Shown in FIG. 1, in the area within the range of the width of a pixel, only the aperture provided with the color filter 141 is an opening for detecting light, the photoelectric signal on the rest of the area is non-effective. As the a-SiH photodiode 132 is in island shape, the dark current A1 along the side walls of the photodiode occupies a main part of the entire dark current. Besides, the transversal current A2 and A3 of the holes and electrons in the doped layer with a certain impedance and stray capacitance of the a-SiH photodiode 132 is the main reason for causing the signal delay of the a-SiH photodiode 132. If the a-SiH photodiode 132 of each pixel is not isolated and insulated from adjacent pixels, transversal current between adjacent pixels will be generated in a heavy doped layer on the bottom, such as a doped layer of N+ type, therefore the outline of the image will be indistinct, and then decrease the identification ability to the image of the processing device, or in other words decrease the effective resolution of the imaging device.

To overcome the drawbacks of existing technology, the present disclosure provides a multispectral imaging device, comprising the following layers and components arranged in sequence following a direction of incident light: a color filter layer comprising an array of a plurality of color filters selectively transparent for specific wavebands; a first transparent electrode layer, transparent for visible light and NIR light; a first conversion layer, to convert visible light into electric signals; a continuous surface with a surface roughness less than 5 nm, a second conversion layer, to convert NIR light electrode signals; and circuit components, processing the electric signals from the first conversion layer and the second conversion layer, respectively. The first continuous surface comprises a second transparent conductive layer and a first insulating film. The second transparent conductive comprises an array of a plurality of pixel electrodes transparent for NIR light and collecting the electric signals of visible light. The first insulating film is arranged between the pixel electrodes, and the first conversion layer covers continuously on the first continuous surface.

Below each embodiment of the present disclosure is described referring to a plurality of figures.

Figure 2:
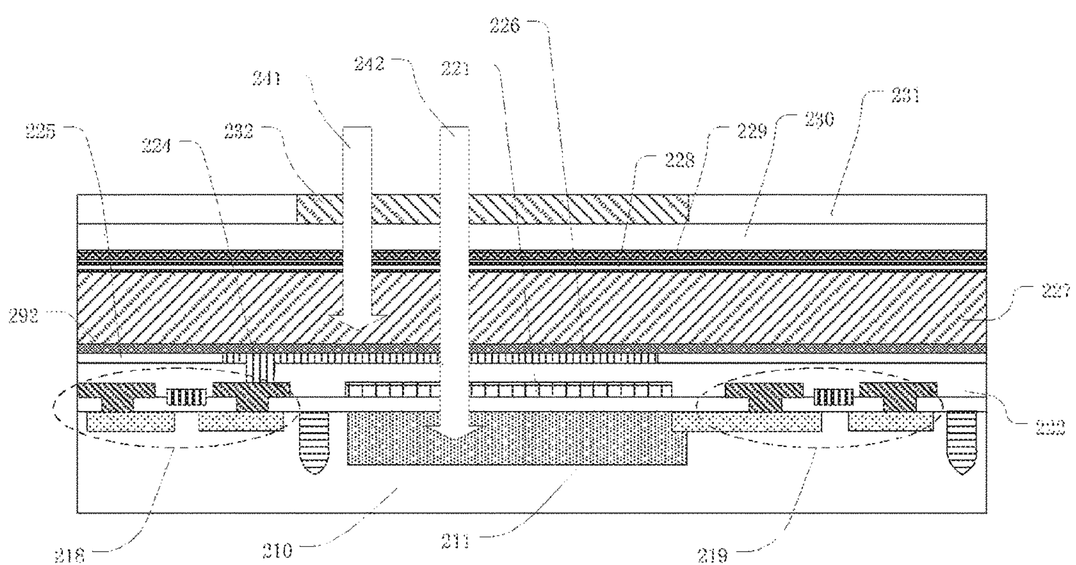
FIG. 2 is a cross-sectional view of a multispectral imaging device according to an embodiment of the present disclosure.

FIG. 2 is a cross-sectional view of a multispectral imaging device according to the present disclosure. The multispectral imaging device shown in FIG. 2 comprises the following layers and components arranged in sequence following the direction of incident light (e.g. light 241, light 242): a color filter layer, a first transparent electrode layer 229, a visible light conversion layer (also referred as the first conversion layer above), an infrared light conversion layer 211 (also referred as the second conversion layer above) and circuit components. In the embodiment, the color filter layer and the visible light conversion layer are both formed on the silicon substrate 210, and the infrared light conversion layer 211 is formed in the silicon substrate 210.

The color filter layer comprises a black matrix 231 and an array of a plurality of color filters 232 arranged in the apertures of the black matrix 231. The color filters 232 are selectively transparent for specific wavebands. In the embodiment, the color filters 232 can comprise a red filter, a blue filter and a green filter transparent for red, blue and green light, respectively. The color filters 232 can further transmit more than 50% of NIR light. The infrared light conversion layer 211 can be a hole depletion layer or an electron depletion layer formed in the silicon substrate 210. All or most of the conversion area of the infrared light conversion layer 211 is covered by the color filters 332 correspondingly.

The visible light conversion layer 226~228 comprises a first doped layer 226, a conversion layer 227 (e.g. an a-SiH film) to convert visible light photons to electrons and a second doped layer 228. The first doped layer 226 and the second doped layer 228 can be used as a hole blocking layer or an electron blocking layer. In the embodiment, the transmittance of the visible light conversion layer 226~228 for NIR light is larger than 50%. The projection of the visible light conversion layer 226~228 on the plane of the silicon substrate 210 covers the color filters 232 and the positions between the color filters 232. In other words, the visible light conversion layer 226~228 is a continuous film on the plane of the silicon substrate 210, then no visible light 241 irradiating with a wide angle can pass through the gap of the visible light conversion layer 226~228 and get to the silicon substrate 210. One role of the arrangement is to have less non-effective photoelectric signals converted from visible light. Another role is to have less interference from visible light image to infrared light image and to have a higher resolution of the multispectral imaging device.

Shown in FIG. 2, specifically, there is further a second transparent electrode layer arranged between the infrared light conversion layer 211 and the visible light conversion layer 226~228. The plurality of pixel electrodes 224 of the second transparent electrode layer form an array and a first insulating film 225 is further provided between the pixel electrodes 224. The plurality of pixel electrodes 224 and the side of the first insulating film 225 away from the infrared light conversion layer 211 together form a first continuous surface 292 with a surface roughness less than 5 nm and almost equal to a mirror surface. The visible light conversion layer 226~228 covers the first continuous surface 292 continuously. The first continuous surface 292 can be formed by polishing the pixel electrode array and the first insulating film with CMP process. After the visible light conversion layer 226~228 is deposited on the continuous surface, the strength of the electric field at the edges and corners of the electrodes will be decreased greatly, to decrease the local leakage current of the conversion layer 227. The local leakage current is usually caused by the following two reasons: high strength of local electric field caused by the point effect of the electrodes; the thickness of the film covering edges of the electrodes or edges of the surface roughness less than that of the flat area. In the present disclosure, local leakage current can be reduced by decreasing greatly or even eliminating segment gap. In the embodiment, an interlayer 221 is further provided between the second transparent electrode layer and the infrared light conversion layer 211. The interlayer 221 can be a transparent conductive film of oxides, to shield electric field between different layers. The interlayer 221 is connected to internal or external control voltage, to form a capacitor between the interlayer 221 and the visible light conversion layer 226~228 on the top or to form a capacitor between the interlayer 221 and the infrared light conversion layer 211. The interlayer 221 covers the most area of the pixel electrodes, and covers most of the conversion area of the infrared light conversion layer 211.

Figure 11:
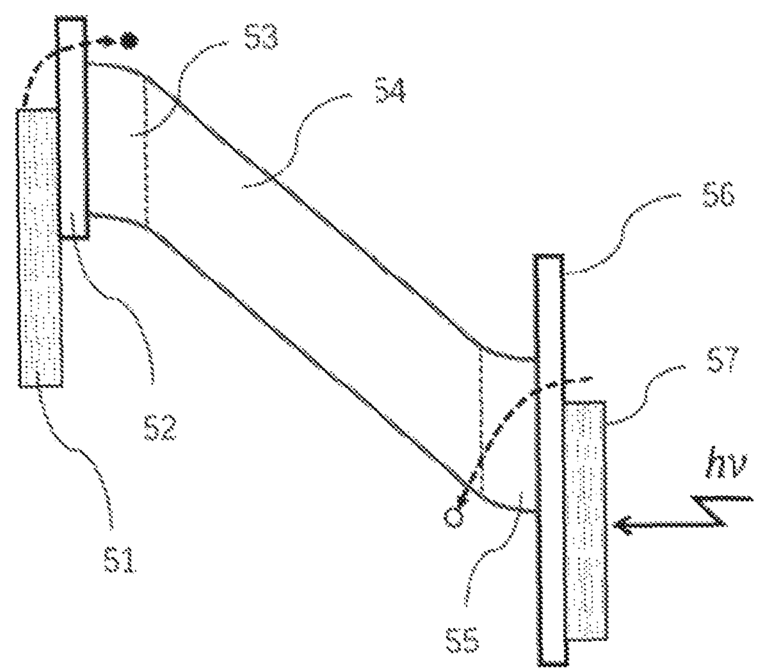
FIG. 11 and FIG. 12 show the energy band diagrams of two kinds of visible light conversion layers.

Shown in FIG. 11, in an embodiment of the present disclosure, the visible light conversion layer 226~228 comprises an a-SiH layer lightly doped of P type with 10-5~10-4 orders of magnitude as a first buffer layer 53 for electric field, an a-SiH layer lightly doped of P type with 10-5 orders of magnitude as a conversion layer 54 for electric field, an a-SiH layer lightly doped of P type with 10-5~10-4 orders of magnitude as a second buffer layer 55. Specifically, during the filming process of the a-SiH film close to the pixel electrodes 51 of the second transparent electrode layer, a tiny quantity of $B_2H_6$ gas is guided into a PECVD reaction chamber, to lightly doping the a-SiH film of P type, and then form an a-SiH layer 53 presenting weak P type conductivity. Under the actuation of the electric field, a part of holes of the layer 53 are depleted to have negative charges left to form space charges, which can mitigate appropriately the high strength of electric field close to the second electron blocking layer 52, to decrease the efficiency of electron injection, so the layer 53 is also referred as the first buffer area for electric field. During the filming process of the a-SiH film close to the first transparent electrode layer 11, a tiny quantity of $PH_3$ gas is guided into the PECVD reaction chamber, to lightly doping the a-SiH film of N type to form an a-SiH layer 55 presenting weak N type conductivity. Under the actuation of the electric field, a part of electrons of the layer 55 are depleted to have positive charges left to form space charges, which can mitigate appropriately the high strength of electric field close to the first hole blocking layer 56, to decrease the efficiency of hole injection, so the area 55 is also referred as a second buffer area for electric field. Therefore, the high strength of electric field in the surface contacting area and the resulting injection dark current can be decreased. P type doping with 10-5 orders of magnitude to the a-SiH conversion layer 54 is mainly used to make the un-doped a-SiH to present weak N-type conductivity, extremely lightly P type doping can even convert the weak N type conductivity to instinct conductivity.

There is further a second electron blocking layer 52 arranged between the pixel electrode 51 of the second transparent electrode layer and the a-SiH layer 53. The second electron blocking layer 52 can be an a-SiH layer or an a-SiC layer doped of P+ type and with a thickness from 20 nm to 100 nm, or an un-doped insulating film such as an a-SiN layer or an a-$SiO_2$ layer, with a thickness from 5 nm to 50 nm.

There is further a first hole blocking layer 56 arranged between the first transparent electrode layer 57 and the a-SiH layer 55. The first hole blocking layer 56 can be a layer comprising oxides of rare earth metal, the thickness of the first hole blocking layer 56 ranges from 5 nm to 50 nm. The hole blocking layer 56 can be an a-SiH or an a-SiC film doped of N+ type and with a thickness from 20 nm to 100 nm, or an un-doped insulating film such as an a-SiN film or an a-$SiO_2$ film, with a thickness from 5 nm to 50 nm. The first hole blocking layer can also be a layer comprising oxides of In, Ga, Zn, with a thickness from 20 nm to 100 nm.

Specifically, when a semiconductor material with a wide band gap such as a semiconductor material comprising oxides of Sn, In, Ni, Ga etc., or a material such as a-SiC, a-SiN, a-$SiO_2$ and etc. is used, the product value of the mobility and the lifetime of the holes is far smaller than that of the electrons, to have a blocking effect to the hole injection. Further, for an oxide of rare earth metal, the product value of the mobility and the lifetime of the holes is also far smaller than that of the electrons, to have a blocking effect to the hole injection. Based on the fact that elements belong to a same system on the periodic table of the elements have similar characters with each other, the colorless or light colored oxides or nitrides of rare earth metals, for example, the oxides or nitrides of light rare earth metals such as lanthanum (La), cerium (Ce), neodymium (Nd), promethium (Pm), samarium (Sm), and heavy rare earth metals such as gadolinium (Gd), dysprosium (Dy), holmium (Ho), erbium (Er), thulium (Tm), ytterbium (Yb), lutecium (Lu), scandium (Sc), yttrium (Y) can all be arranged close to the anode of the visible light conversion layer blocking the dark current injection. The above arrangement has a decreased cost due to the low cost of rare earth metal.

Figure 12:
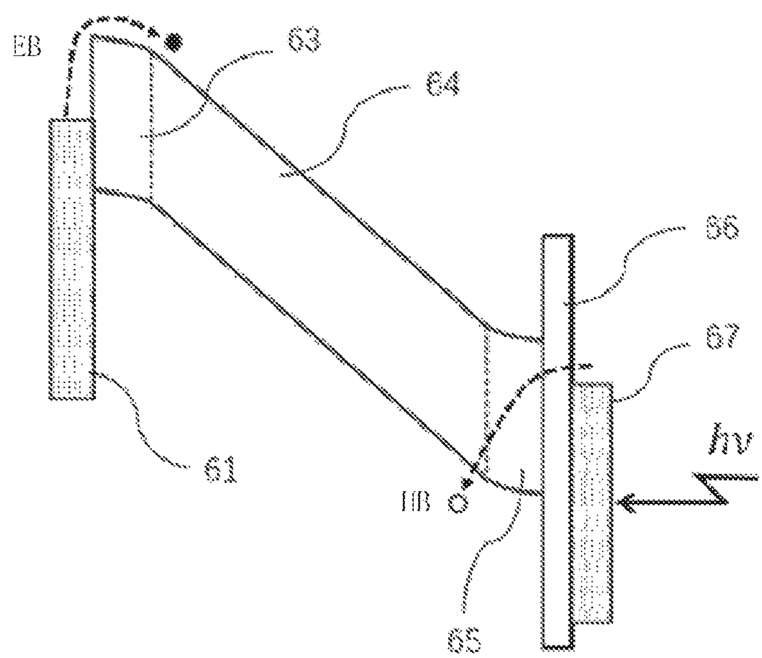

Shown in FIG. 12, in another embodiment of the present disclosure, the visible light conversion layer comprises an a-SiH layer 63 lightly doped of P type, a conversion layer 64, and an a-SiH layer 65 lightly doped of N type. The conversion layer 64 is arranged between the a-SiH layer 65 and the a-SiH layer 63. No blocking layer is needed between the pixel electrode 61 of the second transparent electrode layer and the a-SiH layer 63. The pixel electrode 61 is formed by a transparent conductive material with a high work function to form a high potential barrier (schottky barrier) with the a-SiH layer 63 to block the injected electrons from the electrode. A hole blocking layer 66 is formed between the a-SiH layer 65 and the first transparent electrode layer 67. The hole blocking layer 66 can be a layer comprising oxides of rare earth metal (such as cerium oxide ($CeO_2$)), and with a thickness from 5 nm to 50 nm. The hole blocking layer 66 can also be an a-SiH or an a-SiC layer doped of N+ type and with a thickness from 20 nm to 100 nm, or an insulating film such as an un-doped a-SiN or a-$SiO_2$ film with a thickness from 5 nm to 50 nm. The hole blocking layer 66 can also be a layer comprising the oxides of In, Ga, Zn, and with a thickness from 20 nm to 100 nm. Similar to the above case that a schottky barrier is formed at one side of cathode, when the electrode or transparent conductive oxide film contacts with semiconductor materials, a schottky barrier will also be formed. According to the difference between the work function of the electrode or transparent conductive oxide film and that of semiconductor materials, rectifying action for adjusting electrons to flow in a single direction can be realized, to block external injected electrons or holes.

Further, in the structure shown in FIG. 12, the first transparent electrode layer 67 preferably has a lower work function compared to the pixel electrode 61 of the second transparent electrode layer. Different work functions can be realized by adopting different materials, or a same kind of material with different chemical components, or a same kind of material with different manufacturing processes such as adjusting the oxide molecule component. The first transparent electrode layer 67 and the pixel electrode 61 of the second transparent electrode layer can adopt a transparent conductive oxide. By adjusting the oxide molecule component in the transparent conductive oxide, the surface work function thereof is adjusted, to form a potential barrier for electron blocking at the interface of the pixel electrode 61 of the second transparent electrode layer and the a-SiH film, and form a potential barrier for hole blocking at the interface of the first transparent electrode layer 67 and the a-SiH film.

Further, there is a certain difference between average work functions of different kinds of transparent conductive oxides. Specifically, some conventional transparent conductive oxides can be sequenced by size of work function as follows: $ITO \leq In_2O_3 \leq ZnO_2 \leq Zn_4Sn_3O_{12} \leq Zn_2Sn_2O_5 \leq AGZO \leq MgIn_2O_4 \leq GaInO_3 \leq ZnSnO_3$. The materials listed here are only schematic, other transparent conductive oxides, such as the dual transparent conducting oxide, ternary transparent conducting oxide, or quaternary transparent conducting oxide thereof, or the composition thereof, can all be sequenced by size of work function. Selections can be made referring to the sequence to select a transparent conductive oxide with a high work function as the blocking layer for electron injection, and a transparent conducive oxide with a low work function as the blocking layer hole injection. Seen from the circuit structure of the conversion layer, the transparent conducting oxide with a high work function is used as a cathode applied with negative voltage, the transparent conducting oxide with a low work function is used as an anode applied with positive voltage. Further, the surface work function of the transparent conductive oxide varies as the filming process and later annealing process thereof may be different. By adjusting the processes, ITO with a high work function can be made as the cathode, ITO with a low work function can be made as the anode.

Shown in FIG. 2, the visible light conversion layer is stacked on an integrated circuit chip of CMOS. The visible light conversion layer absorbs incident visible light 241 to generate electrons or holes. Photo-generated electrons or holes can be moved to positive electrode or negative electrode under the actuation of electric field in the visible light conversion layer. The external voltage of the visible light conversion layer is decided by the voltage difference between the first transparent electrode layer 229 arranged on the top and the pixel electrode 224 of the second transparent electrode layer arranged in the middle. The pixel electrode 224 of the second transparent electrode layer is connected to the source electrode of the switch transistor 218. When a high voltage is applied to the gate electrode of the transistor 218 to turn on the transistor 218, the photo-generated charges stored therein will be read out to external circuit. Incident NIR light 242 passes through the color filter 232, the visible light conversion layer and, to be converted by the infrared light conversion layer 211 to electrons or holes and stored in each sub-pixel. When a threshold voltage is applied on the gate electrode of the switch transistor 219 to turn on the transistor 219, the photo-generated charges stored therein are read out to external circuit. The CMOS imaging device shown in FIG. 2 can be a simple pixel structure composed of a photodiode PD and a switch transistor, as described above, or a more complicated pixel circuit structure of CMOS APS (Active pixel sensor).

Combining FIG. 3-FIG. 10, the method for manufacturing the multispectral imaging device of the present disclosure will be described as follows. FIG. 3-FIG. 10 show the manufacturing process of the multispectral imaging device according to an embodiment of the present disclosure.

Figure 3:
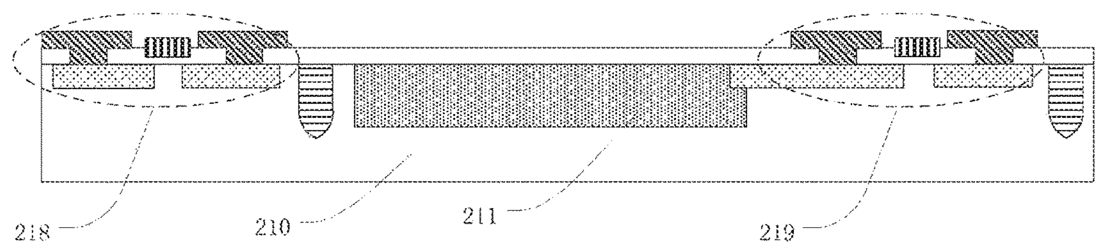
FIG. 3 to FIG. 10 show the manufacturing process of the multispectral imaging device according to the embodiment of the present disclosure.

The first step is shown in FIG. 3, firstly a silicon substrate 210 is provided, then an infrared light conversion layer 211 and switch transistors 218, 219 are formed on the silicon substrate 210. In order to increase the NIR light absorption depth of the infrared light conversion layer, the silicon substrate 210 can also be formed by growing a silicon composite substrate presenting weak P type or N type conductivity with epitaxial method on a silicon substrate heavily doped of P type or N type.

Figure 4:
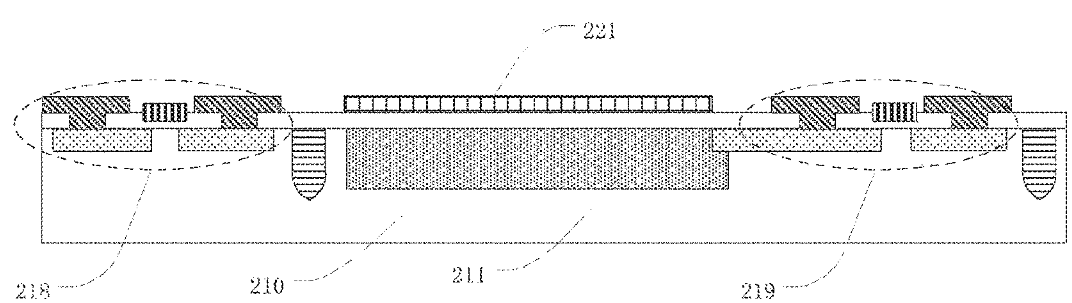

The next step is shown in FIG. 4, an interlayer 221 transparent and conductive is deposited and patterned, the interlayer 221 is connected to internal or external control voltage.

Figure 5:
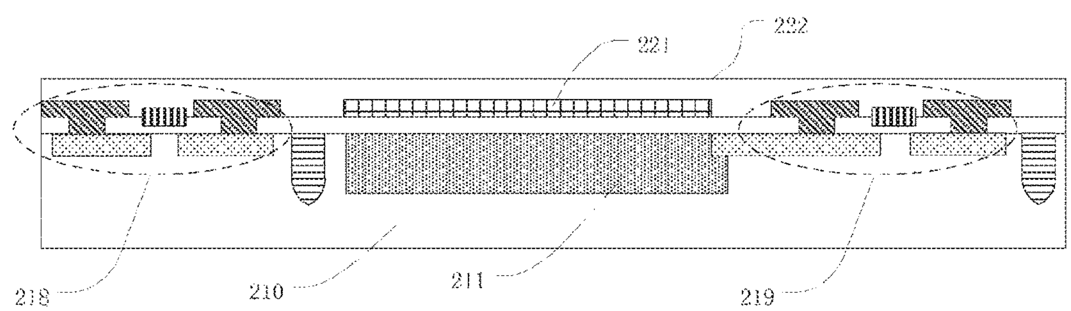

The next step is shown in FIG. 5, an insulating film 222 (such as a $SiO_2$ film or a SiN film) is deposited to protect the switch transistors 218, 219 and the interlayer 221.

Figure 6:
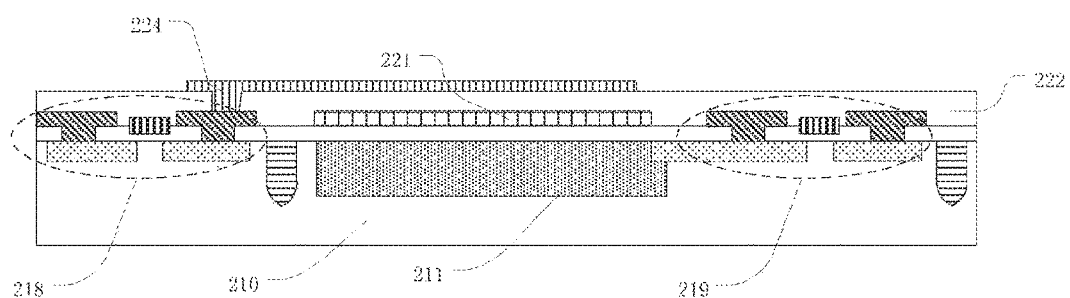
Figure 7:
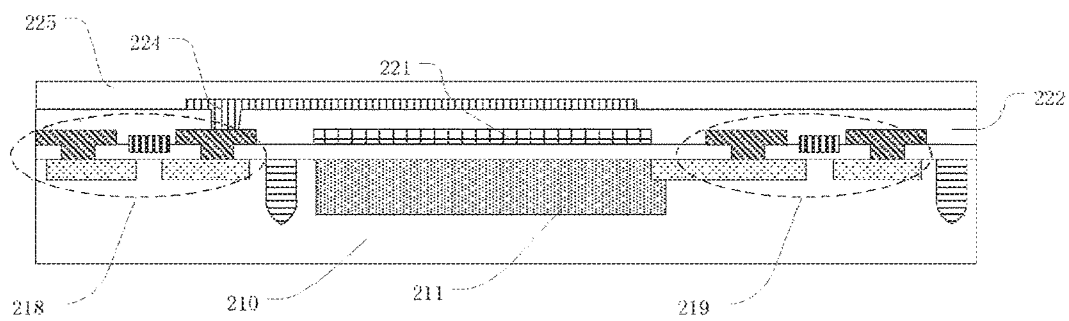
Figure 8:
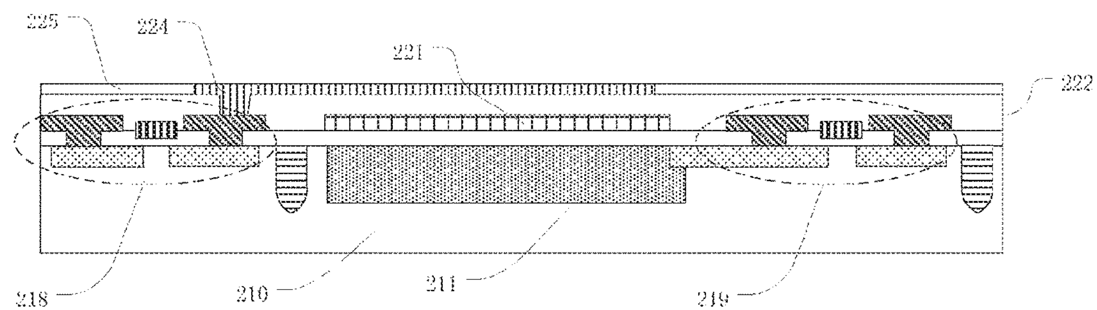

The next step is shown in FIG. 6 to FIG. 8, firstly a second transparent electrode layer is formed on the insulating film 222. To ensure enough process redundancy during polishing, the height of the second transparent electrode layer is preferably larger than 50 nm. For the convenience of etching and polishing, the second transparent electrode layer is preferably in amorphous state, the hardness thereof is relatively low to have an easy control of the etching precision. The second transparent electrode layer is connected to the switch transistor 218 arranged below through the via holes and is etched to a pixel electrode array comprising a plurality of pixel electrodes 224. In a specific embodiment, an organic film with a thickness larger than that of the pixel electrode is formed by a coating process on the array and a drying process. The coating process can be performed with an linearly coating machine or a rotatably coating machine to coat an organic film with solvent. Then a CMP process is performed to polish the surface of the array and the organic film used as a first insulating film 225, to form a first continuous surface. The CMP process is required to polish the surface till the pixel electrode is exposed and the segment gap of the first continuous surface is smaller than 5 nm. The surfaces of the array and the organic film are cleaned, and then an annealing process to the product is performed in a container with a certain temperature. One role of the annealing process is to crystallize the amorphous film of pixel array, and to eliminate the stress and damage in the surface and inside of the film caused by the CMP process. Considering the characteristic of the materials forming the pixel electrode and the insulating film on the top, the annealing temperature should be in a range of 200~1000 degree centigrade. In the embodiment, before polishing, the height (equal to the thickness) of the second transparent electrode layer counting from the bottom surface of the second transparent electrode layer is indicated as h, similarly, the maximum height of the first insulating film counting from the bottom surface of the second transparent electrode layer (maybe not equal to the maximum thickness thereof) is indicated as H (the maximum height of the first insulating film exists within the range of adjacent second transparent electrodes). The first insulating film on the second transparent electrode layer is polished to decrease at least 2% of the thickness of the second transparent electrode layer, to ensure the pixel electrode of the second transparent electrode layer is exposed even if a certain vertical deviation of the surface of the silicon chips exists. To ensure the surface flatness after polishing, preferably, the height H needs to be larger than 1.02h before polishing.

Figure 9:
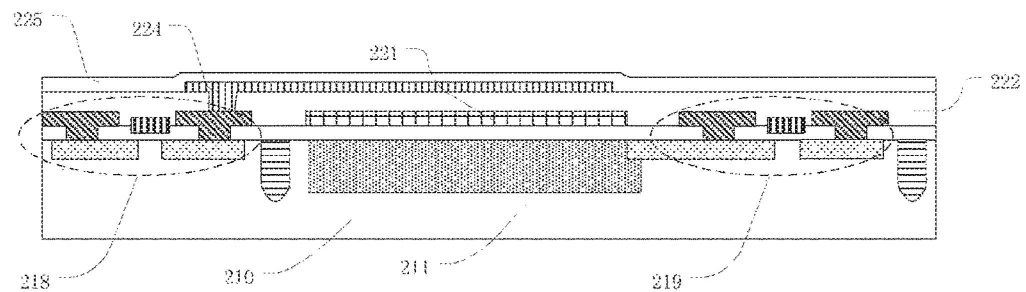

In another specific embodiment, shown in FIG. 9, a film deposition method such as plasma enhanced chemical vapor deposition (PECVD) is performed to deposit an inorganic film such as a $SiO_2$ film or a SiN film on the second transparent electrode layer. Therefore a height of the inorganic film counting from the bottom surface of the second transparent electrode layer is larger than 102% of the thickness of the second transparent electrode layer. Then a CMP process is performed to form the first continuous surface with a surface roughness less than 5 nm.

As another specific embodiment, a composite insulating film formed by the inorganic film stacking on the organic film can be used as the first insulating film. One role of the arrangement is to fill gaps and corners of the electrodes with the organic film coated below. Another role is to have a better interface characteristic (electric, chemical interface characteristic and surface adhesion characteristic) between the inorganic film on the top and the visible light conversion layer or the second hole or electron blocking layer. In the embodiment of the composite insulating film, the maximum height of the composite insulating film counting from the bottom surface of the second transparent electrode layer is larger than 102% of the thickness of the second transparent electrode layer. The maximum height of the organic film coated below counting from the bottom surface of the second transparent electrode is smaller than 98% of the thickness of the second transparent electrode layer, so that the exposed part on the first continuous surface after polishing is basically the second transparent electrode and the inorganic film, the area of the organic film exposed is less than 5% of the total area of the composite insulating film.

Figure 10:
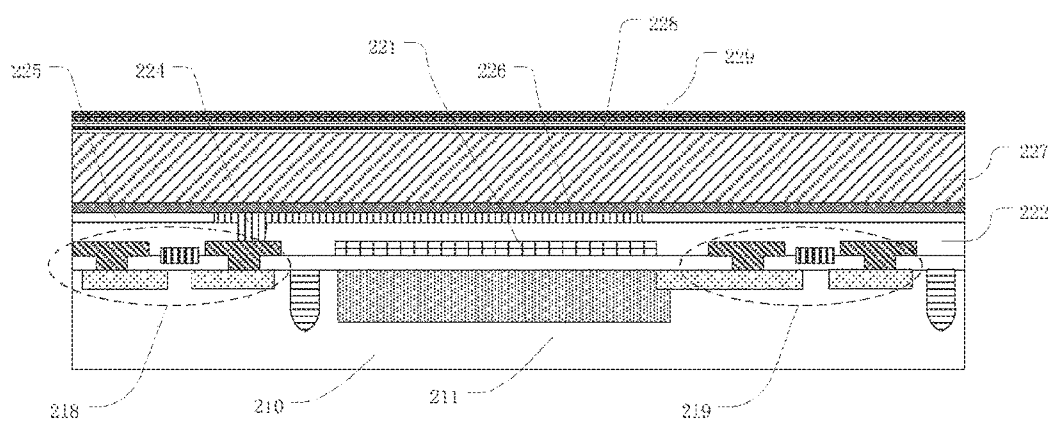

Shown in FIG. 10 and FIG. 2, the visible light conversion layer and the first transparent conductive layer 229 are filmed continuously. The first transparent conductive layer 229 is connected to an external control voltage end. Then, a passivation protection film 230, RGB color filters 232 and a black matrix 231 are filmed. The passivation protection film 230 has the function of protecting the first transparent conductive layer 229 and the visible light conversion layer from moisture.

Hence, after depositing the visible light conversion layer on the first continuous surface, the strength of the electric field at edges and corners of the electrodes are decreased greatly, to decrease the local leakage current of the a-SiH film 227. Such kind of local leakage current is usually caused by two reasons as follows: the relatively high strength of local electric field caused by the point effect of electrode; and the smaller thickness of the film covering the edges of the electrode or the edges of the segment gap compared to the flat area. In the present disclosure, local leakage current can be avoided by decreasing or even eliminating the segment gap.

Another two embodiments of the present disclosure will be described referring to FIG. 11 and FIG. 12. Shown in FIG. 11, an electron or hole blocking layer with a wide band gap is deposited on the first continuous surface. The blocking layer can not only block injected electrons or holes, but also can block transversal flow of charges. Specifically, a PECVD process deposits any one film of an a-SiC film doped of P+ type, an un-doped a-SiN or a-$SiO_2$ film and a NiO (nickel oxide) film on the pixel electrode 51 of the second transparent electrode layer, to be a second electron blocking layer 52, the thickness of the second electron blocking film 52 is ranging roughly from 10 nm to 50 nm. Then a PECVD process or other processes are performed on the second electron blocking layer 52 to film an un-doped a-SiH film or an a-SiH film extremely lightly doped of P type as a conversion layer 54. The doping concentration thereof should be less than 5×10-5. To decrease the high strength of electric field on the surface contacting area and to reduce the resulting injection dark current, a small quantity of $B_2H_6$ gas is guided into the PECVD reaction chamber, to lightly doping the area of the conversion layer 54 close to the second electron blocking layer 52 with a doping concentration greater than that of the layer 54. Therefore an a-SiH layer 53 lightly doped of P type is formed. Under the actuation of the electric field, space charges are formed by the negative charges formed after a part of holes of the layer 53 are depleted, to weaken appropriately the high strength of electric field close to the second electron blocking layer, and thereby decreasing the efficiency of electron injection. So the layer 53 is also referred as the first buffer area of electric field. A small amount of $PH_3$ is guided into the PECVD reaction chamber, to dope the conversion layer 54 lightly of N type, and then form an a-SiH layer between the conversion layer 54 and the first hole blocking layer 56. Under the actuation of the electric field, space charges are formed by the positive charges formed after a part of electrons of the area 55 are depleted, to weaken appropriately the high strength of electric field close to the first hole blocking layer, to decrease the efficiency of hole injection. Therefore the area 55 is also referred as the first buffer area of electric field. The first hole blocking layer 56 is formed between the first electric field buffer area 55 and the first transparent electrode layer 57. The first hole blocking layer 56 can be a layer comprising oxides of rare earth metal, such as cerium oxide ($CeO_2$), and with a thickness from 5 nm to 60 nm. The hole blocking layer 56 can also be an a-SiC film doped of N+ type or an un-doped a-SiN or a-$SnO_2$ film, and with a thickness thereof from 5 nm to 50 nm. The first hole blocking layer 56 can also be a layer comprising oxides of In, Ga, Zn, and with a thickness from 20 nm to 100 nm. The first hole blocking layer 56 can also be an a-SiH film doped of N+ type, and with a thickness from 20 nm to 100 nm. The energy band of the photoelectric conversion film is shown in FIG. 11. According to different requirements, the above filming sequence can also be in reverse, surely with a reversed actuation voltage, and a reversed direction of incident light.

Referring to FIG. 12, similar with the structure of FIG. 11, the layer 63 and the layer 65 are respectively an a-SiH layer lightly doped of P type and an a-SiH layer lightly doped of N type. The difference between the structure in FIG. 11 and the structure in FIG. 12 is that no blocking layer is needed between the pixel electrode 61 of the second transparent electrode layer and the a-SiH layer 63. The pixel electrode 61 of the second transparent electrode layer is a transparent conductive oxide (TCO) with a high work function. Therefore a higher potential barrier (schottky barrier) is formed between the pixel electrode 61 of the second transparent electrode layer and the layer 63, to block injected from electrodes. A hole injection blocking layer 66 is formed between the a-SiH layer 65 and the first transparent electrode 67 for hole blocking, the component and the thickness of the layer 66 are similar with that described above referring to FIG. 11.

Figure 13:
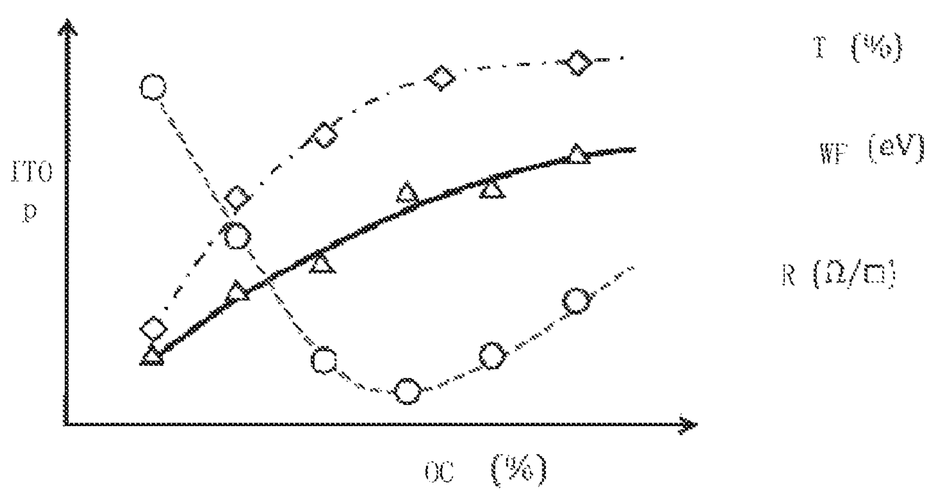
FIG. 13 shows the property curve of an ITO film in 80 nm thick.

Further, to increase the height of the schottky barrier blocking electrons, in the electronic potential diagram of FIG. 12, the work function of the second transparent electrode is required to be larger than that of the first transparent electrode. Different materials can be adopted to acquire electrodes with different work functions. Or a same kind of TCO material with different filming processes and annealing processes can be adopted to acquire electrodes of different work functions. This provides the manufacturing process a relative flexibility and the possibility to decrease the cost. FIG. 13 is a graph showing the relationships between the oxygen content (OC) and three most important photoelectric properties (i.e. transmission (T), resistivity (R) and work function (WF)) in the case of sputtering an ITO film with a thickness of 80 nm. The oxygen content of ITO can be adjusted by two methods, one is to adjust the parameters like partial pressure of oxygen guided into the reaction chamber, radio frequency voltage and an automatic bias of target materials and etc. of the reaction chamber for magnetron sputtering, another is to adjust conditions of the annealing process after the CMP process, such as lightly adjusting the oxygen environment and temperature. By process adjustment, an ITO film with a higher work function is formed as the cathode, an ITO film with a lower work function is formed as the anode. Similarly, such kind of manufacturing process can also be used to other TOC materials.

On that account, in the present disclosure, multiple layers comprising the blocking layer for electron and hole injection, the buffer layer for electric field and the conversion layer are deposited on the first continuous surface having a surface roughness less than 5 mm and almost equal to a mirror surface. Therefore the strength of the electric field at edges and corners of each separate pixel electrode is decreased greatly, to decrease the local leakage current of the visible light conversion layer at the edge of the pixel electrode. Besides, with the arrangement of the electron or hole blocking layer in the visible light conversion layer and the buffer area for electric field close to the electron or hole blocking layer, the present disclosure also decreases the dark current injected from the anode or cathode, and increases the homogeneity and signal to noise ratio of signals.

The electron or hole blocking layer has asymmetric heights of potential barriers to electrons or holes, to form unilateral conductivity selectivity to electrons or holes. The electron or hole blocking layer of the insulating film comprising oxides or nitrides has an I-V characteristic similar to a MIS tunnel diode, and the probability of carriers getting over the barrier heights extremely depends on the height and thickness of the barrier and the electric field strength at two ends of the barrier. When the thickness of the barrier is doubled, the current may be decreased by at least three orders of magnitudes. Such apparent nonlinearity results in that the transversal conductivity between the first pixel electrodes is basically restrained. While unilaterally conductivity of single carrier can be realized by a stronger electric field and a thicker blocking layer of insulating film.

Considering the characteristic of anisotropic conductivity of the electron or hole blocking layer filmed on the first continuous surface, the transversal leakage current between adjacent pixel electrodes is restrained. Therefore, there is no need to divide the conversion layer into islands according to the size of each pixel electrode. Thereby, not only the structure of the device and manufacturing process are simplified, but also the effective utilization ratio of the photoelectric conversion film is increased, the sidewall leakage current in the case of the conversion layer being divided into islands is eliminated, to basically eliminate the color mixture and photoelectric crosstalk caused by incident light irradiating with a wide angle. Therefore, there is no need to arrange excessive photo masks to prevent the color mixture and crosstalk, thereby preventing the utilization ratio of light from being decreased excessively. By this way, the gap between the pixels can be reduced even to a distance of 0.5 um~10 um without influencing the effective aperture ratio of the first photoelectric conversion film layer, therefore a multispectral imaging device having both high resolution and wide power margin can be realized.

The basic concept and a plurality of embodiments of the present disclosure are described above. Here a statement need to be made that the present disclosure is not limited by the above specific embodiments, the person skilled in the art may make all kinds of transformations and amendments and combinations within the scope of claims, which will not influence the actual contents of the present disclosure. The present disclosure is also not limited to medical imaging application as described in the present disclosure, it may also be used in other fields such as industrial and agriculture products, environment monitoring and diagnosis, recognition of personal identity, instruments in gaming industry, virtual reality and augmented reality and etc.

What is claimed is:

1. A multispectral imaging device, comprising the following layers and components arranged along a direction of incident light:

- a color filter layer, comprising an array of color filters transparent selectively to specific wavebands;
- a first transparent electrode layer, transparent for visible light and NIR light;
- a first conversion layer, to convert visible light to electric signals, formed by an a-SiH layer lightly doped of P type;
- a first continuous surface, formed by a second transparent electrode layer and a first insulating film, wherein said second transparent electrode layer comprising a plurality of pixel electrodes, collecting the electric signals of visible light and transparent for NIR light, said first insulating film arranged between said pixel electrodes, said first conversion layer arranged between said first transparent electrode layer and said first continuous surface and covering said first continuous surface continuously;
- a second conversion layer, to convert NIR light to electric signals; and circuit components, to respectively process the electric signals from said first conversion layer and said second conversion layer.

2. The multispectral imaging device according to claim 1, wherein, said first continuous surface is at least polished with a CMP process to have a surface roughness less than 5 nm, and processed by heating with a temperature above 300 degree centigrade.

3. The multispectral imaging device according to claim 1, further comprising an interlayer, which is transparent and conductive arranged between said pixel electrode array and said second conversion layer, to shield electric field between said first conversion layer and said second conversion layer, wherein NIR light transmittance of said interlayer is larger than 60%.

4. The multispectral imaging device according to claim 3, wherein, a projection of said interlayer covers more than 80% of an area of said pixel electrodes and more than 80% of an area of said second conversion layer.

5. The multispectral imaging device according to claim 1, wherein said first conversion layer comprises the following layers arranged along the direction of the incident light:

a first electron blocking layer;

a first buffer layer for electric field, formed by an a-SiH layer lightly doped of P type;

a conversion layer formed by an a-SiH layer lightly doped of P type;

a second buffer layer for electric field formed by an a-SiH layer lightly doped of N type; and a second hole blocking layer.

6. The multispectral imaging device according to claim 5, wherein each of said first electron blocking layer and said second electron blocking layer comprises an a-SiH or a-SiC film, a NiO film or a Sb2S3 film doped of P type, and has a thickness from 20 nm to 100 nm.

7. The multispectral imaging device according to claim 5, wherein each of said first hole blocking layer and said second hole blocking layer comprises an a-SiH or a-SiC film doped of N+ type, and has a thickness from 20 nm to 100 nm.

8. The multispectral imaging device according to claim 5, wherein each of said first hole blocking layer and said second hole blocking layer comprises an un-doped a-SiN or a-SiO2 film, and has a thickness from 5 nm to 50 nm.

9. The multispectral imaging device according to claim 5, wherein each of said first hole blocking layer and said second hole blocking layer comprises a layer formed by oxides of rare earth metal, and has a thickness from 5 nm to 50 nm.

10. The multispectral imaging device according to claim 5, wherein each of said first hole blocking layer and said second hole blocking layer comprises oxides of In, Ga, Zn, and has a thickness from 20 nm to 200 nm.

11. The multispectral imaging device according to claim 1, wherein said first conversion layer comprises the following layers arranged along the direction of the incident light:

a first hole blocking layer;

a first buffer layer for electric field, formed by an a-SiH layer lightly doped of N type;

a conversion layer, formed by an a-SiH layer lightly doped of P type;

a second buffer layer for electric field, formed by an a-SiH layer lightly doped of P type; and a second electron blocking layer.

12. The multispectral imaging device according to claim 1, wherein one of said first transparent electrode layer and said second transparent electrode layer arranged on both sides of said first conversion layer is used as a cathode applied with a lower potential, the other one is used as an anode applied with a higher potential, a work function of the cathode is larger than that of the anode.

13. The multispectral imaging device according to claim 12, wherein the cathode or the anode comprises indium tin oxides, and oxygen component of the cathode is higher than that of the anode.

14. The multispectral imaging device according to claim 1, wherein a gap between adjacent pixel electrodes on said first continuous surface is in a range of 0.5 um to 10 um.

* * * * *